United States Patent
Wu et al.

(10) Patent No.: US 11,955,163 B2
(45) Date of Patent: Apr. 9, 2024

(54) METHOD AND CIRCUIT FOR ADAPTIVE COLUMN-SELECT LINE SIGNAL GENERATION

(71) Applicant: ELITE SEMICONDUCTOR MICROELECTRONICS TECHNOLOGY INC., Hsinchu (TW)

(72) Inventors: Po-Hsun Wu, Hsinchu (TW); Jen-Shou Hsu, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 154 days.

(21) Appl. No.: 17/875,449

(22) Filed: Jul. 28, 2022

(65) Prior Publication Data
US 2024/0038293 A1    Feb. 1, 2024

(51) Int. Cl.
*G11C 11/408*    (2006.01)
(52) U.S. Cl.
CPC .................. *G11C 11/4087* (2013.01)
(58) Field of Classification Search
CPC .......... G11C 11/4087; G11C 11/4076
See application file for complete search history.

(56) References Cited

U.S. PATENT DOCUMENTS

| | | | |
|---|---|---|---|
| 6,163,498 A * | 12/2000 | Moon | G11C 8/00 365/194 |
| 6,359,828 B1 * | 3/2002 | La | G11C 11/4087 365/230.06 |
| 6,434,082 B1 | 8/2002 | Hovis et al. | |
| 6,600,342 B1 * | 7/2003 | Lee | G11C 7/1048 326/112 |
| 7,158,426 B2 | 1/2007 | van der Zanden et al. | |
| 2003/0103396 A1 * | 6/2003 | Maruyama | G11C 7/1045 365/201 |
| 2003/0202385 A1 * | 10/2003 | Shin | G11C 11/4087 365/194 |
| 2005/0030798 A1 * | 2/2005 | Lim | G11C 11/4076 365/190 |
| 2007/0036008 A1 * | 2/2007 | Park | G11C 11/4096 365/189.09 |
| 2019/0180804 A1 * | 6/2019 | Min | G11C 5/14 |

* cited by examiner

*Primary Examiner* — Jerome Leboeuf

(57) ABSTRACT

Method and circuit for adaptive column-select line signal generation for a memory device are provided. The method comprises the following steps. A first signal is generated in response to a memory access command. A second signal is generated according to a candidate signal selected from a plurality of candidate signals including a first candidate signal and a second candidate signal, wherein after the first signal is asserted, the first candidate signal is asserted when a configurable time interval with respect to a parameter from a register set elapses and the second candidate signal is asserted when a specified time interval elapses, and the selected candidate signal is asserted before a remaining part of the candidate signals after the first signal is asserted. A column-select line signal is generated according to the first signal and the second signal.

11 Claims, 17 Drawing Sheets

METHOD AND CIRCUIT FOR ADAPTIVE COLUMN-SELECT LINE SIGNAL GENERATION

BACKGROUND OF THE INVENTION

1. Field of the Invention

The present disclosure relates to a circuit for column-select line signal generation, and in particular to a circuit for column-select line signal generation.

2. Description of the Related Art

Referring to FIG. 1, architecture of a bit-line sense amplifier of a dynamic random access memory (DRAM) is illustrated. In FIG. 1, a sense amplifier SA is used in the DRAM for read or write operation. The sense amplifier SA has terminals connected to pairs of bit lines, denoted by BL and $\overline{BL}$, and has terminals electrically coupled to a pair of data lines, denoted by DL and $\overline{DL}$, through a switch (e.g., transistors) controlled by a column-select line (CSL) signal.

Referring to FIG. 2, operations of the DRAM of FIG. 1 with respect to a column-select line (CSL) signal is illustrated in a timing diagram, wherein the signal names above a dash-dotted line, such as signals CK_t, command (e.g., write (WR) or read (RD)), LDQS_t, DQ[0:7], represent external signals (e.g., originating from external device such as a host), and the signal names below the dash-dotted line, such as BL, CSL, DL and so on, represent internal signals (e.g., originating from control circuitry of the DRAM for internal operations). Referring to FIG. 1 and FIG. 2, when a read command is performed in the DRAM, the CSL signal is asserted (e.g., at a high state) for a specified time period, i.e., an access cycle, so that the switches are turned on and the data read from the memory cell (not shown) to the bit lines can be applied to the data lines through the switches. When a write command is performed in the DRAM, the CSL signal is asserted for a specified time period, i.e., an access cycle, so that the switches are turned on and the data to be written into the memory cell (not shown) at the data lines can be applied to the bit lines through the switches. As shown in FIG. 2 for the CSL signal, after the access cycle, the CSL signal is de-asserted (e.g., at a low state).

Referring to FIG. 2, for the operations of a write command (e.g., denoted by WR), the corresponding data line signals (e.g., denoted by DL and $\overline{DL}$) are required by the memory specification to be reset gradually to their respective proper voltage levels during the pre-charge cycle after the access cycle elapses. If the corresponding data line signals (e.g., denoted by DL and $\overline{DL}$) cannot be reset to their respective proper voltage levels for the operations of write or read commands, subsequent write or read operation in the DRAM device may fail.

BRIEF SUMMARY OF THE INVENTION

An objective of the present disclosure is to provide a method and a circuit for adaptive column-select line signal generation for a memory device in order to adaptively control the column-select line signal, thus facilitating stability of access operations of the memory device.

To achieve at least the above objective, the present disclosure provides a method for adaptive column-select line signal generation for a memory device, the method comprising the following steps. A first signal is generated in response to a memory access command. A second signal is generated according to a candidate signal selected from a plurality of candidate signals including a first candidate signal and a second candidate signal, wherein after the first signal is asserted, the first candidate signal is asserted when a configurable time interval with respect to a parameter from a register set elapses and the second candidate signal is asserted when a specified time interval elapses, and the selected candidate signal is asserted before a remaining part of the candidate signals after the first signal is asserted. A column-select line signal is generated according to the first signal and the second signal.

In some embodiments, the step of determining the second signal comprises the following steps. The selected candidate signal from the plurality of candidate signals is determined, wherein the selected candidate signal is asserted before the remaining part of the candidate signals after the first signal is asserted. The selected candidate signal is output as the second signal.

In some embodiments, the step of determining the second signal further comprises the following steps. The first candidate signal is generated according to the configurable time interval with respect to the parameter from the register set after the first signal is asserted. The second candidate signal is generated according to the specified time interval after the first signal is asserted.

In some embodiments, the step of generating the column-select line signal comprises the following steps. The first signal and the second signal are received to generate the column-select line signal. The column-select line signal is asserted after the first signal is asserted. The column-select line signal is de-asserted after the second signal is asserted.

To achieve at least the above objective, the present disclosure provides a circuit for adaptive column-select line signal generation. The circuit comprises an initiation signal generating circuit, a column-select line (CSL) signal control circuit, and a CSL signal output circuit. The initiation signal generating circuit is configured to generate a first signal in response to a memory access command. The CSL signal control circuit is configured to generate a second signal according to a candidate signal selected from a plurality of candidate signals including a first candidate signal and a second candidate signal, wherein after the first signal is asserted, the first candidate signal is asserted when a configurable time interval with respect to a parameter from a register set elapses and the second candidate signal is asserted when a specified time interval elapses, and the selected candidate signal is asserted before a remaining part of the candidate signals after the first signal is asserted. The CSL signal output circuit is configured to generate a column-select line signal according to the first signal and the second signal.

In some embodiments, the CSL signal control circuit comprises a control circuit configured to determine the selected candidate signal from the plurality of candidate signals, wherein the selected candidate signal is asserted before the remaining part of the candidate signals after the first signal is asserted, and the control circuit is configured to output the selected candidate signal as the second signal.

In some embodiments, the CSL signal control circuit further comprises a first candidate signal generating circuit and a second candidate signal generating circuit. The first candidate signal generating circuit is configured to generate the first candidate signal according to the configurable time interval with respect to the parameter from the register set after the first signal is asserted. The second candidate signal generating circuit is configured to generate the second candidate signal according to the specified time interval after the first signal is asserted.

In some embodiments, the CSL signal output circuit comprises: a first signal input terminal, a second signal input terminal, an output terminal, and an output logic circuit. The first signal input terminal is used for receiving the first signal. The second signal input terminal is used for receiving the second signal. The output terminal is used for outputting the column-select line signal. The output logic circuit is used for generating the column-select line signal, wherein the output logic circuit is configured to assert the column-select line signal after the first signal is asserted; and the output logic circuit is configured to de-assert the column-select line signal after the second signal is asserted.

DETAILED DESCRIPTION OF THE INVENTION

To facilitate understanding of the object, characteristics and effects of this present disclosure, embodiments together with the attached drawings for the detailed description of the present disclosure are provided.

Before providing various embodiments according to the present disclosure in a variety of aspects, it is to show the inventors' observations and investigations of generation of a column-select line (CSL) signal during the operations of a DRAM device.

Figure 1:
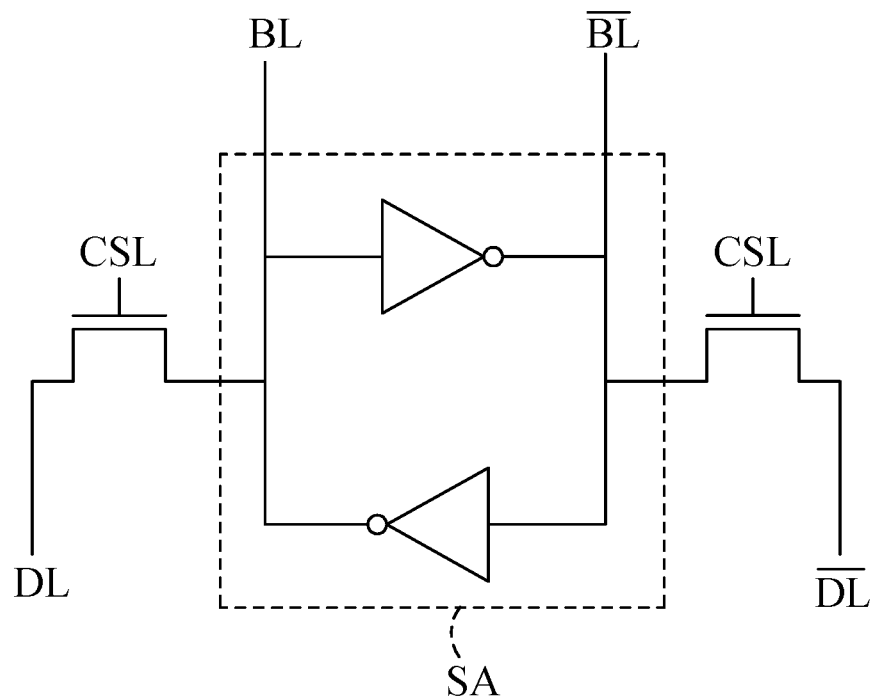
FIG. 1 (Prior Art) is a drawing illustrating architecture of a bit-line sense amplifier of a dynamic random access memory (DRAM).
Figure 2:
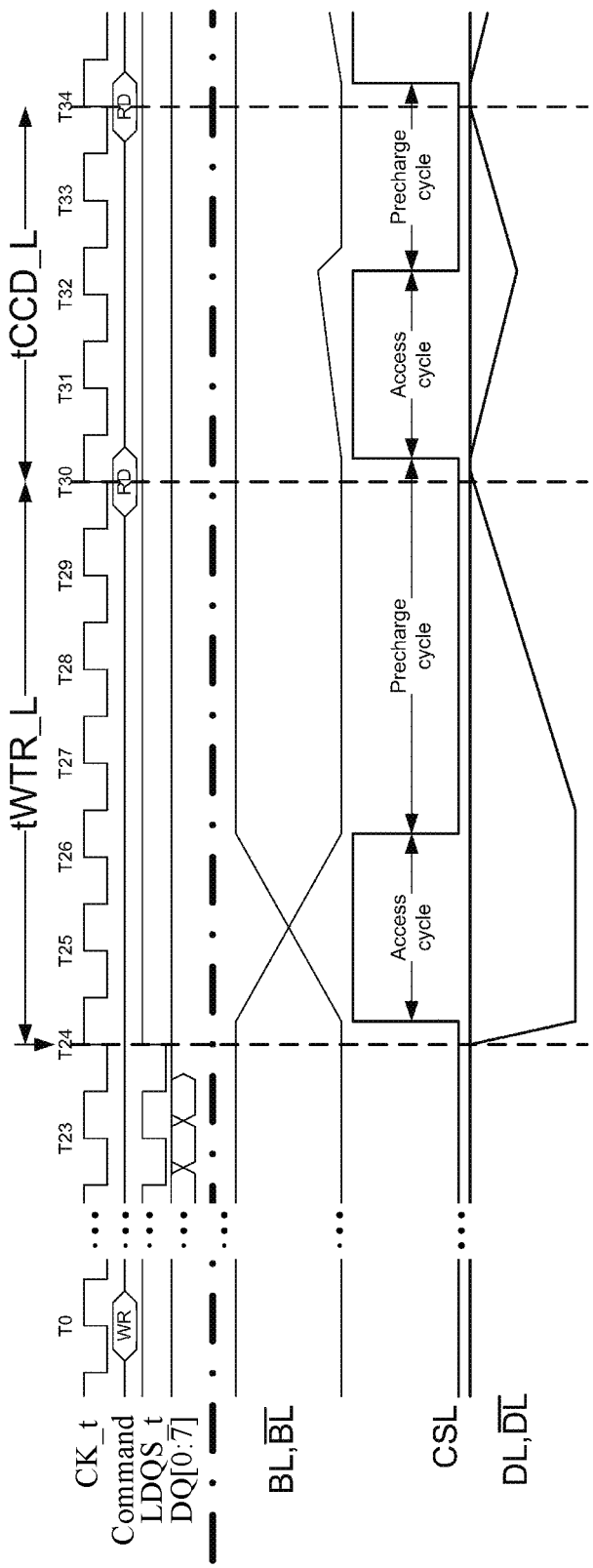
FIG. 2 (Prior Art) is a timing diagram illustrating operations of the DRAM of FIG. 1 with respect to a column-select line (CSL) signal.
Figure 3:
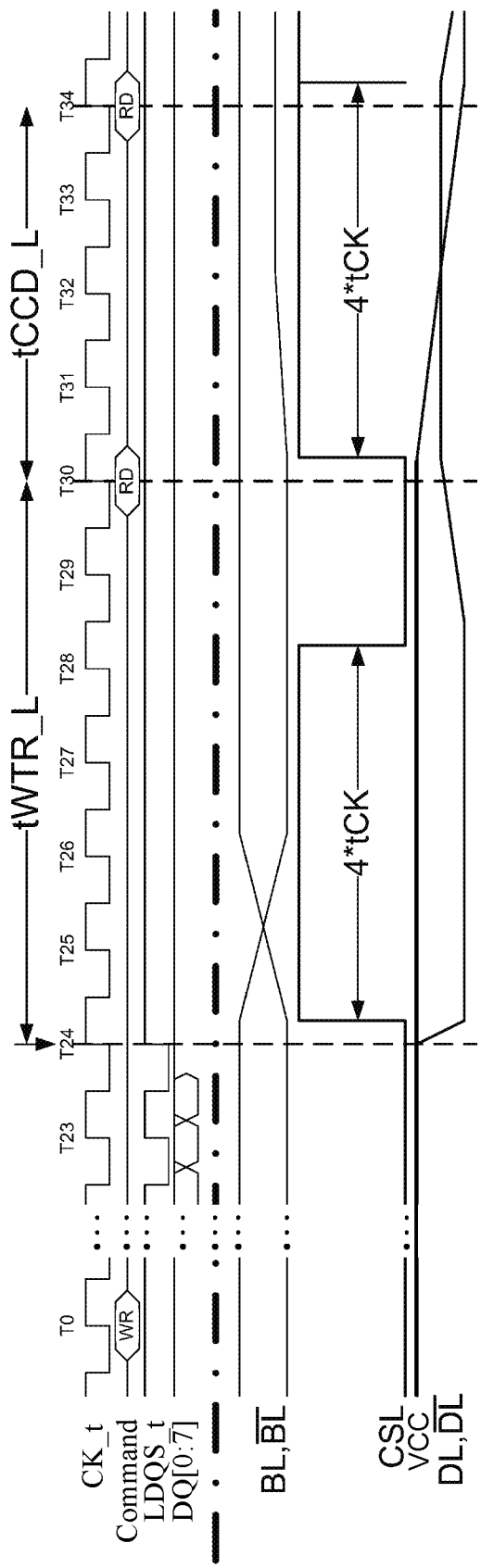
FIG. 3 is a timing diagram illustrating an issue that a column-select line (CSL) signal has an insufficient pre-charge cycle.

In an example, a control circuit of a DRAM device is configured to generate a column-select line (CSL) signal with an access cycle of a specified number of clock cycles, denoted by k*tCK, according to a configurable parameter k, wherein k is a configurable parameter indicating the specified number of clock cycles. For example, the parameter k is stored or programmed, for example, in a register set, such as mode registers compliant with a memory specification such as DDR2, DDR3, DDR4 or so on (referred as to DDR series). According to the DDR series memory specification adopted by the DRAM device, appropriate values for the parameter k can be provided or programmed in the DRAM device's control circuit and the parameter k can be set to one of the provided values in response to a setting by way of the DRAM device's control circuit or a computer system that uses the DRAM device. However, in some cases, as the inventor observes, the value of the parameter k may be set to an inappropriate value so that a column-select line (CSL) signal has an insufficient pre-charge cycle. Refer to FIG. 3, which is a timing diagram illustrating an issue that a column-select line (CSL) signal has an insufficient pre-charge cycle. In the example illustrated by FIG. 3, the parameter k has a value of 4 and thus the column-select line (CSL) signal has an access cycle of 4 clock cycles (e.g., 4*tCK), leaving a pre-charge cycle of 2 clock cycles only (e.g., 2*tCK). In a worst case, as exemplified in FIG. 3, for the operations of a write command with a delay from start of internal write transaction to internal read command to a same bank group (e.g., denoted by tWTR_L or referred to as a write-to-read command delay), the corresponding data line signals (e.g., denoted by DL and $\overline{DL}$) cannot be reset to their respective proper voltage levels (e.g., a higher voltage level, such as a supply voltage VCC, for DL and a lower voltage level, such as a ground voltage, for $\overline{DL}$) during the pre-charge cycle after the access cycle elapses because the pre-charge cycle has two clock cycles only (i.e., 2*tCK). Consequently, the DRAM device fails to perform a read command with a CAS_n-to-CAS_n command delay to same bank group (e.g., denoted by tCCD_L or referred to as a long delay between commands) after the write command is done because the data line signals DL and $\overline{DL}$ have not been reset to their respective proper voltage levels during the previous write command, wherein CAS stands for column-address-strobe. Besides, as illustrated in FIG. 3, the read command with tCCD_L is to be performed in 4 clock cycles, but the column-select line (CSL) signal has an access cycle of 4 clock cycles (e.g., 4*tCK) with a delay, also leading to the failure of the operations of the read command.

Figure 4:
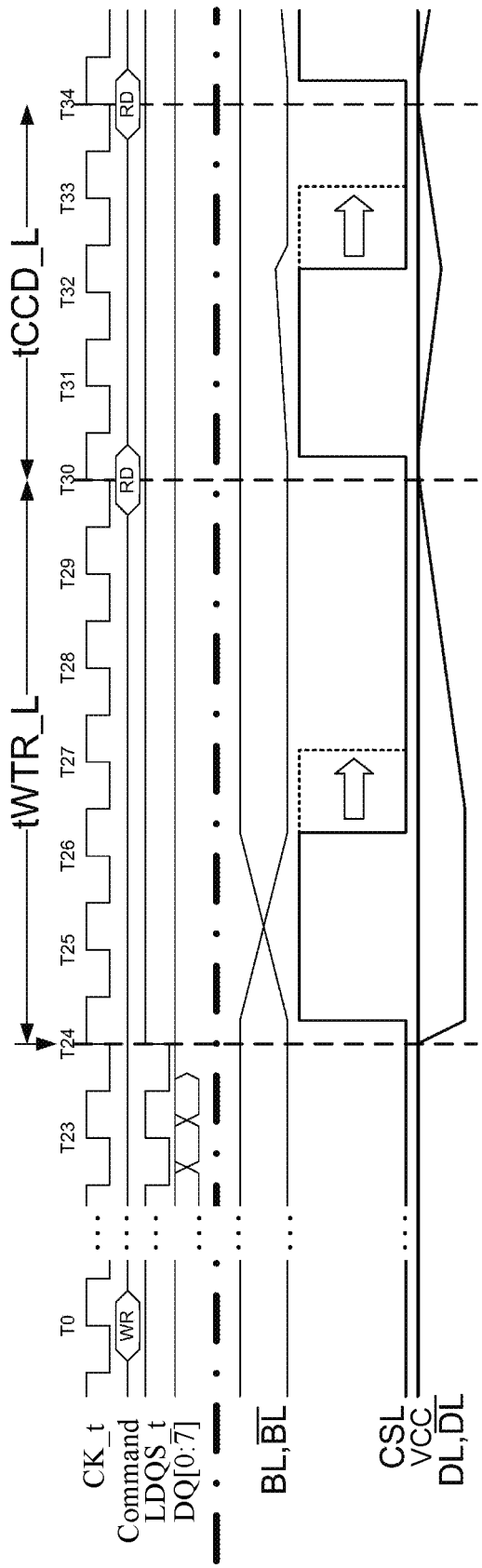
FIG. 4 is a timing diagram illustrating another issue that a column-select line (CSL) signal has an access time longer than what is designed due to manufacturing variation.

In another example, a control circuit of a DRAM device is configured to generate a column-select line (CSL) signal with an access cycle of a specified time interval. For example, the specified time interval is restricted to a value compliant with DDR series memory specification by way of a dedicated signal generating circuit utilized in the control circuit. According to the DDR series memory specification adopted by the DRAM device, the signal generating circuit can be designed for generating the column-select line (CSL) signal as specified by way of internal circuit components. However, in some cases, as the inventor observes, the signal generating circuit may be affected by process, voltage, and temperature (PVT) variations so that a column-select line (CSL) signal has an insufficient pre-charge cycle. Refer to FIG. 4, which is a timing diagram illustrating an issue that a column-select line (CSL) signal has an access time (e.g., 3.5 ns or above) that is longer than the specified time interval (e.g., 2.5 ns) because of manufacturing (such as PVT) variations of the DRAM device. In the example illustrated by FIG. 4, a thick arrow indicates that a falling edge in solid lines as designed for the access cycle of the column-select line (CSL) signal is extended to an actual falling edge in dashed lines, leading to a reduced pre-charge cycle. It would cause potential risks to subsequent operations of the DRAM device. In a worst case, the pre-charge cycle may be so insufficient that the corresponding data line signals (e.g., denoted by DL and $\overline{DL}$) cannot be reset to their respective proper voltage levels during the operations of write or read commands, leading to failure of write or read in the DRAM device.

In view of the above issues that the inventors observe and investigate, technology for adaptive column-select line (CSL) signal generation is provided by way of various embodiments according to the present disclosure in a variety of aspects in the following.

Figure 5:
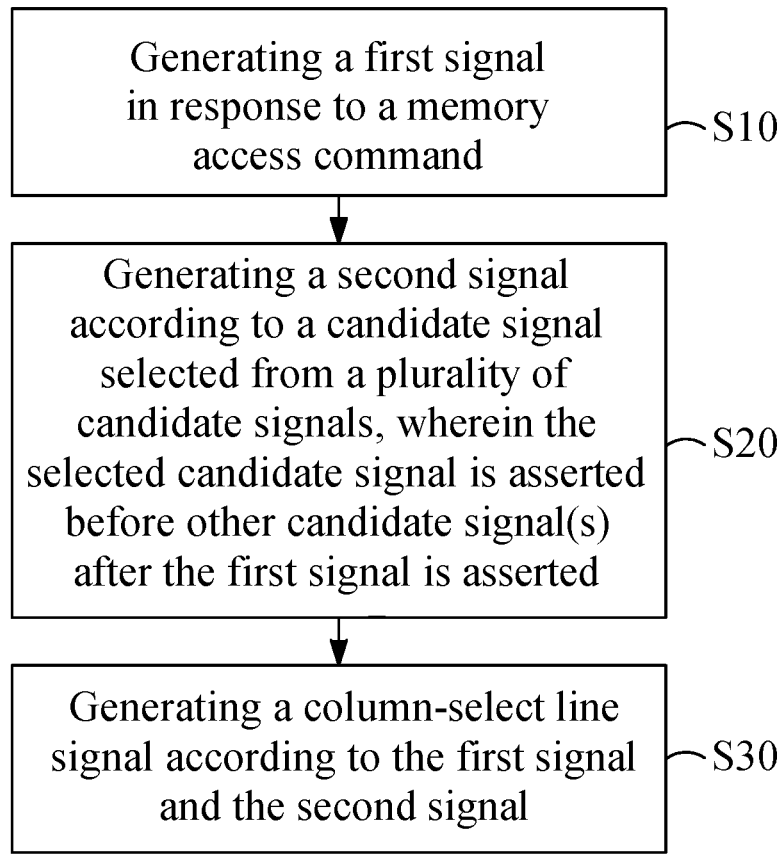
FIG. 5 is a flowchart illustrating a method for adaptive column-select line (CSL) signal generation according to an embodiment of the present disclosure.

Refer to FIG. 5, which is a flowchart illustrating a method for adaptive column-select line (CSL) signal generation according to an embodiment of the present disclosure, which can represent various embodiments based on that of FIG. 5. As shown in FIG. 5, the method for adaptive column-select line signal generation for a memory device comprises steps S10-S30.

In step S10, a first signal (e.g., denoted by CAI) is generated in response to a memory access command.

In step S20, a second signal (e.g., denoted by CAD) is generated according to a candidate signal selected from a plurality of candidate signals wherein the selected candidate signal is asserted before the remaining not selected candidate signal(s) of the plurality of candidate signals after the first signal is asserted. The plurality of candidate signals may include at least two or more candidate signals.

In step S30, a column-select line (CSL) signal is generated according to the first signal (CAI) and the second signal (CAD).

By way of the method shown in FIG. 5, the column-select line (CSL) signal can be generated adaptively according to the first signal (CAI) and the second signal (CAD) because the second signal (CAD) can be generated according to a selected candidate signal from a plurality of candidate signals. The plurality of candidate signals can be implemented to be asserted in different timing after the first signal is asserted. Accordingly, the method shown in FIG. 5 can be implemented to control the column-select line (CSL) signal adaptively.

Regarding "asserting" (or its alternative forms such as "asserted" or "assertion") for a signal, it means that the signal is set to its active state (or active voltage level), either high or low. Regarding "de-asserting" (or its alternative forms such as "de-asserted" or "de-assertion" or "deasserted" or "deassertion") for a signal, it means that the signal is set to its inactive state (or inactive voltage level), either high or low. If a signal is active-low, "asserting" the signal means setting the signal low, and "de-asserting" the signal means setting the signal high. If a signal is active-high, "asserting" the signal means setting the signal high and "de-asserting" the signal means setting the signal low.

Figure 6:
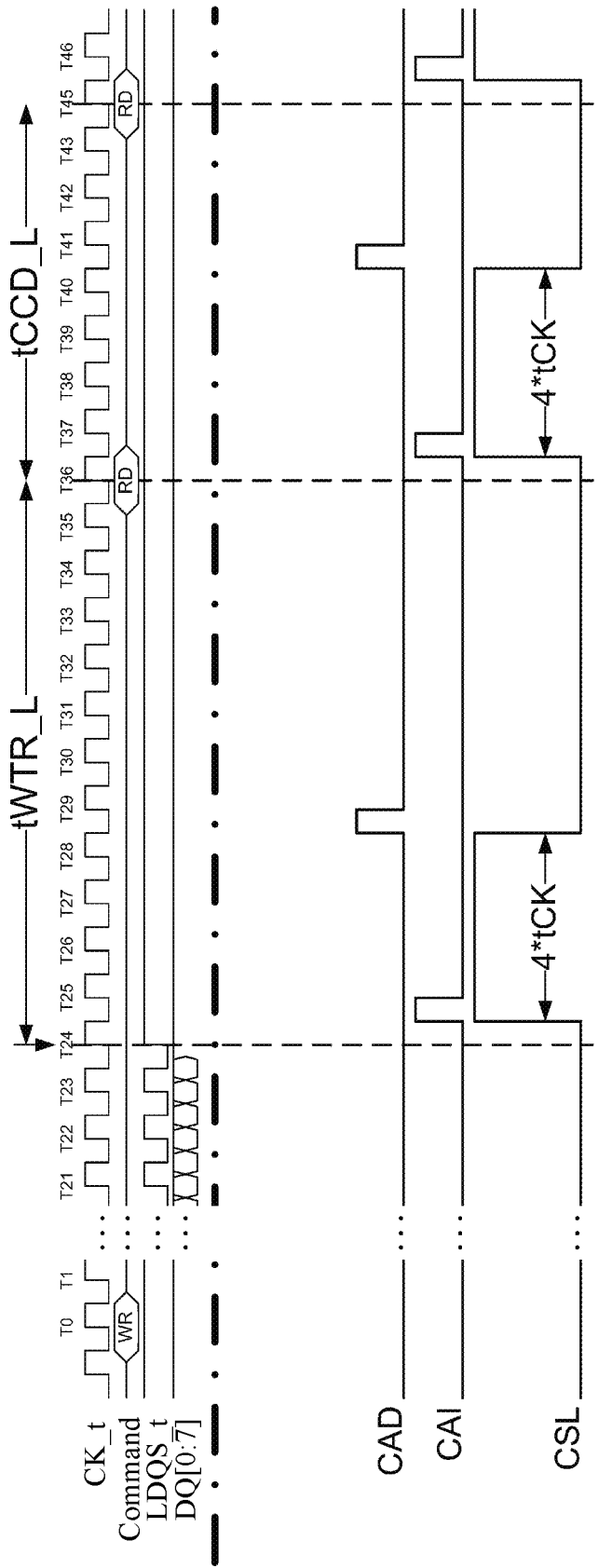
FIG. 6 is a timing diagram illustrating a column-select line (CSL) signal for a DRAM, generated according to a first signal (CAI) and a second signal (CAD) according to an embodiment of the present disclosure.

Refer to FIG. 6, which is a timing diagram illustrating a column-select line (CSL) signal for a DRAM, generated according to a first signal (CAI) and a second signal (CAD) according to an embodiment based on that shown in FIG. 3. As illustrated in FIG. 6, when a write or read command (e.g., denoted by "WR" or "RD", respectively) is issued in the DRAM device, such a DRAM device compliant with a memory specification such as DDR2, DDR3, DDR4 or so on, a first signal (e.g., denoted by CAI) is asserted (e.g., asserted for a period of time as a pulse) after a time interval for a number of specified clock cycles required by the memory specification elapses so as to indicate initiation (or beginning) of an access cycle of the column-select line (CSL) signal. For example, when a write command is issued in the DRAM device, a first signal (CAI) is asserted after a time interval equal to a write latency plus an extra number of clock cycles elapses, wherein the write latency (WL) is equal to a sum of a CAS write latency (CWL) and an additive latency (AL). In an example, the write latency (WL) is set to 20 (clock cycles) with CWL=20 and AL=0. As illustrated in FIG. 6, in response to the write command issued at period T0 of the clock signal CK_t, the first signal (CAI) is asserted as a pulse (e.g., at period T24 of the clock signal CK_t) after a time interval of 24 clock cycles (e.g., WL=20 plus the extra number of 4 clock cycles) elapses. As shown in FIG. 6, after the CSL signal is asserted, a second signal (e.g., denoted by CAD) is asserted (e.g., asserted for a period of time as a pulse) so as to indicate ending of an access cycle of the column-select line (CSL) signal or indicate initiation (or beginning) of a precharge cycle of the column-select line (CSL) signal. The second signal (CAD) is asserted according to a candidate signal selected from a plurality of candidate signals, as will be exemplified below. Certainly, the implementation of the invention is not limited to the examples. In some examples, a first signal (CAI) is asserted after a time interval equal to a write latency of WL=50 (clock cycles) with CWL=30 and AL=20 plus an extra number of 2 or 4 clock cycles, in a DRAM device compliant with the memory specification for DDR4, so as to implement the method based on FIG. 5.

Figure 7:
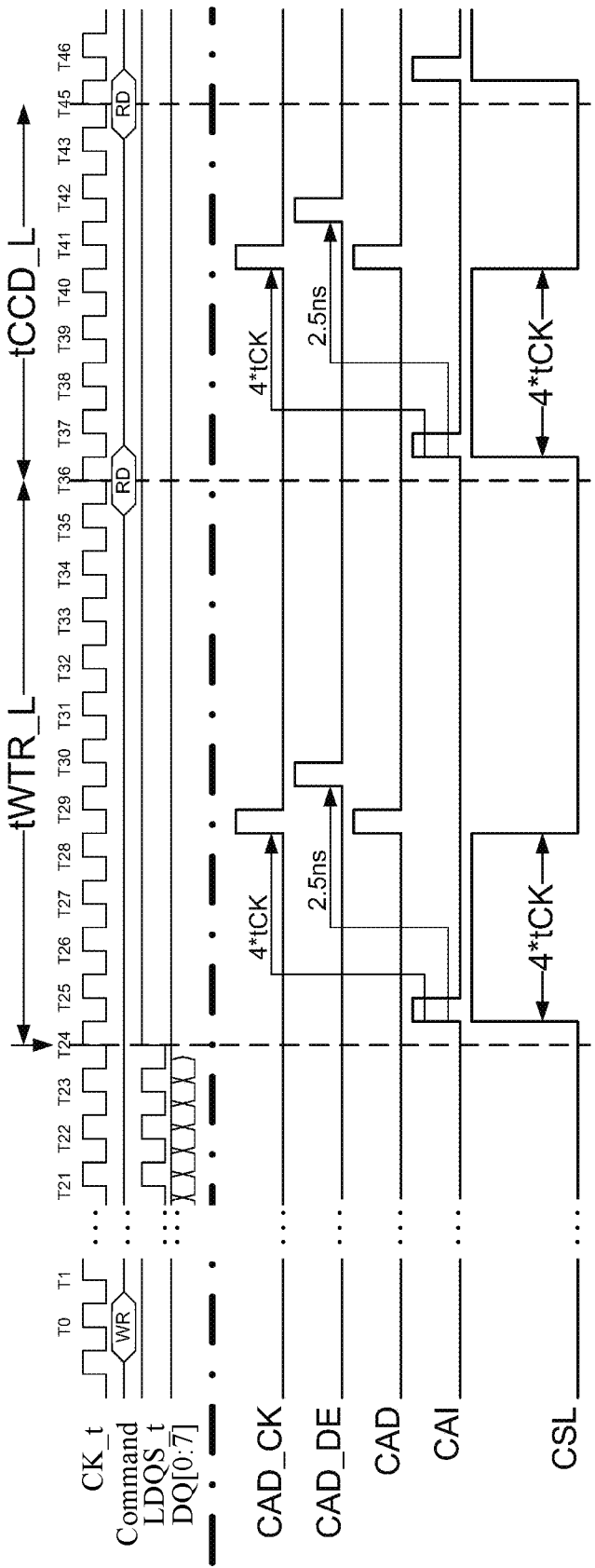
FIG. 7 is a timing diagram illustrating an example of generating a column-select line (CSL) signal based on the embodiment shown in FIG. 5 with the second signal (CAD) generated according to candidate signals.

Refer to FIG. 7, which is a timing diagram illustrating an example of generating a column-select line (CSL) signal based on the embodiment shown in FIG. 3 with the second signal (CAD) generated according to candidate signals. In FIG. 7, the candidate signals include a candidate signal CAD_CK and a candidate signal CAD_DE. After the first signal (CAI) is asserted, the candidate signal CAD_CK is asserted when a configurable clock cycles of k*tCK (e.g., k=4) elapses and the candidate signal CAD_DE is asserted when a specified clock cycles (e.g., 2.5 ns) elapses. In this case, the candidate signal CAD_CK is asserted before the candidate signal CAD_DE is asserted so that the second signal (CAD) is determined based on the candidate signal CAD_CK, resulting in the column-select line (CSL) signal with an access cycle of 4*tCK. In this manner, the column-select line (CSL) signal will have a sufficient pre-charge cycle either for a write command with a write-to-read command delay (tWTR_L) or a read command with a long delay between commands (tCCD_L), wherein tCCD_L is for example set to 8 (e.g., tCCD_L is set in the mode registers).

Figure 8:
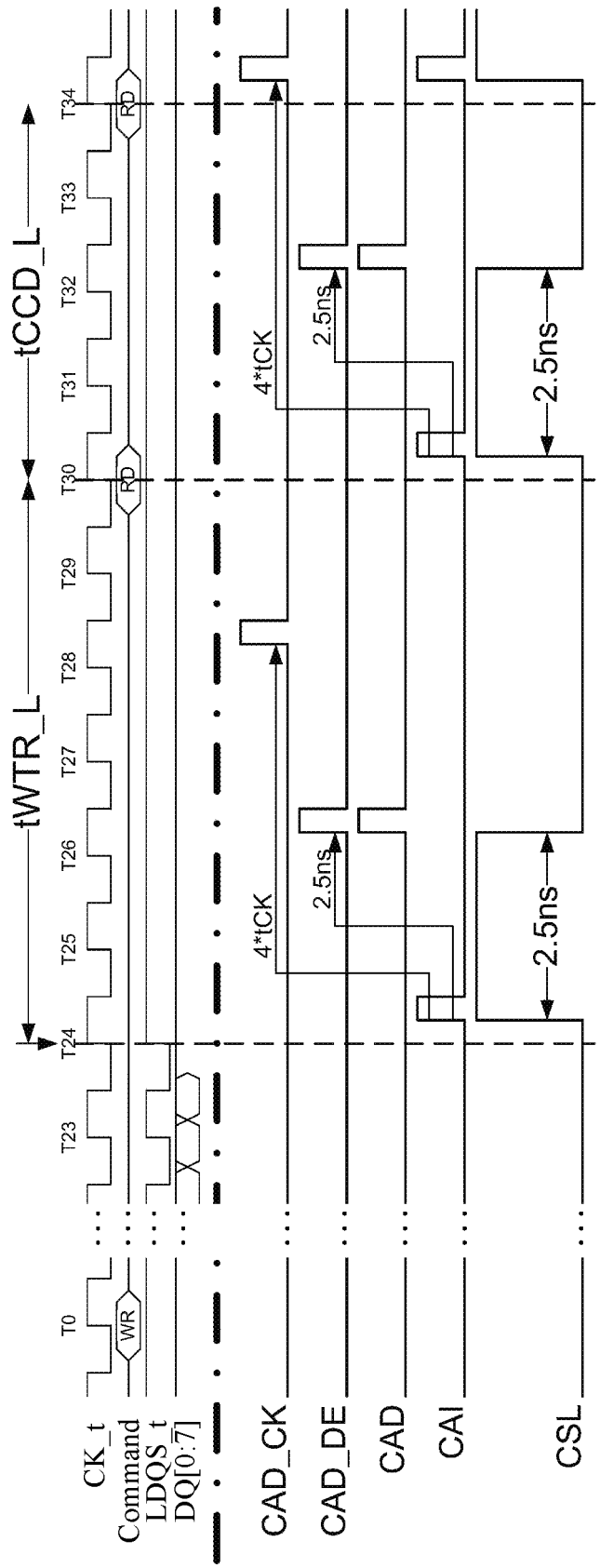
FIG. 8 is a timing diagram illustrating another example of generating a column-select line (CSL) signal based on the embodiment shown in FIG. 5 with the second signal (CAD) generated according to candidate signals.

Refer to FIG. 8, which is a timing diagram illustrating another example of generating a column-select line (CSL) signal based on the embodiment shown in FIG. 3 with the second signal (CAD) generated according to candidate signals. By contrast, the clock frequency illustrated in the example of FIG. 8 is lower than that of FIG. 7. Thus, a period of clock cycle (e.g., tCK) in the example of FIG. 8 is greater than that of FIG. 7. In FIG. 8, after the first signal (CAI) is asserted, a candidate signal CAD_CK is asserted when a configurable clock cycles of k*tCK (e.g., k=4) elapses and the candidate signal CAD_DE is asserted when a specified clock cycles (e.g., 2.5 ns) elapses. In this case, the candidate signal CAD_DE is asserted before the candidate signal CAD_CK is asserted so that the second signal (CAD) is determined based on the candidate signal CAD_DE, resulting in the column-select line (CSL) signal with an access cycle of 2.5 ns. In this manner, the column-select line (CSL) signal will have a sufficient pre-charge cycle either for a write command with tWTR_L or a read command with tCCD_L, wherein tCCD_L is for example set to 8.

In some embodiments, the step of determining the second signal (CAD) (step S20) comprises the following steps. One of the plurality of candidate signals which is asserted before the remaining part (or other candidate signal(s)) of the plurality of candidate signals is determined as the selected candidate signal after the first signal is asserted. The selected candidate signal is thus output as the second signal (CAD).

In some embodiments, the step of determining the second signal (CAD) (step S20) further comprises the following steps. A first one of the plurality of candidate signals (e.g., CAD_CK) is generated according to a configurable time interval with respect to a parameter from a register set (e.g., including one or more registers) after the first signal is asserted. A second one of the plurality of candidate signals (e.g., CAD_DE) is generated according to a specified time interval after the first signal is asserted. For example, the register set is a mode register set compliant with a memory specification such as DDR2, DDR3, DDR4 or so on (DDR series). For example, the configurable time interval can be equal to the parameter k times a clock cycle period (tCK), wherein k may be a value not less than 2 and tCK may be about 2.5 ns, 1.25 ns, 0.625 ns, or so on. For example, as illustrated in FIGS. 7 and 8, the first signal (e.g., CAI), candidate signals (e.g., CAD_CK, CAD_DE), second signal (e.g., CAD) are respectively asserted in the form of pulse signals and respective pulse widths of these pulse signals are less than the CSL signal. Certainly, the implementation of the invention is not limited to the examples.

In some embodiments, the step of generating the column-select line (CSL) signal (step S30) comprises following steps. The first signal (CAI) and the second signal (CAD) are received to generate the column-select line (CSL) signal. The column-select line (CSL) signal is asserted after the first signal (CAI) is asserted. The column-select line (CSL) signal is de-asserted after the second signal (CAD) is asserted.

Figure 9:
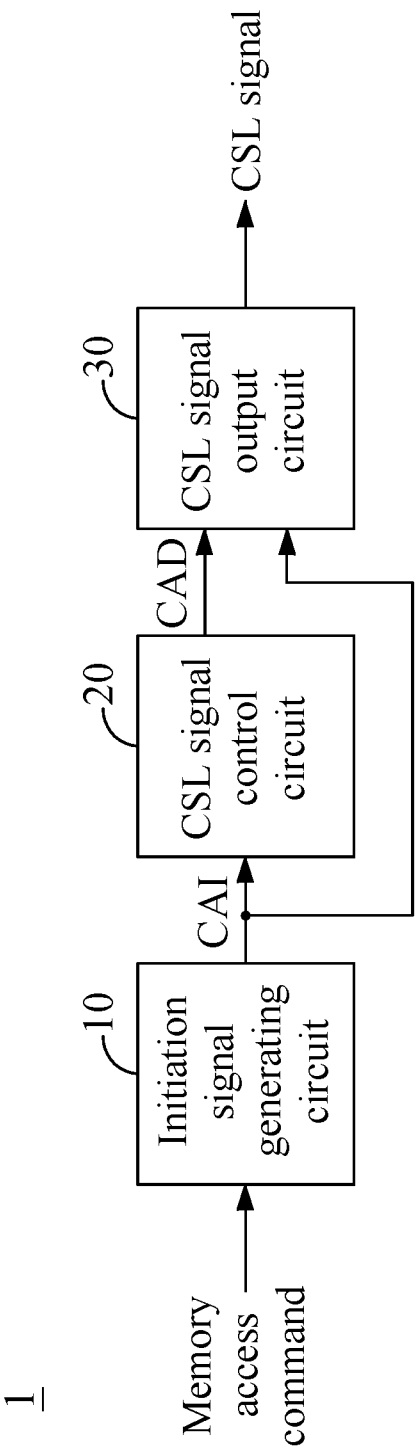
FIG. 9 is a block diagram illustrating architecture of a circuit for generating a column-select line (CSL) signal according to a first signal (CAI) and a second signal (CAD) according to an embodiment of the present disclosure.

Refer to FIG. 9, which is a block diagram illustrating architecture of a circuit for generating a column-select line (CSL) signal according to a first signal (CAI) and a second signal (CAD) according to an embodiment of the present disclosure. In FIG. 9, the circuit for adaptive column-select line signal generation 1 comprises an initiation signal generating circuit 10, a CSL signal control circuit 20, and a CSL signal output circuit 30. The initiation signal generating circuit 10 is configured to generate a first signal (CAI) in response to a memory access command. The CSL signal control circuit 20 is coupled to the initiation signal generating circuit 10 and configured to generate a second signal (CAD) according to a candidate signal selected from a plurality of candidate signals wherein the selected candidate signal is asserted before the remaining part (or other candidate signal(s)) of the plurality of candidate signals after the first signal is asserted. The CSL signal output circuit 30 is coupled to the CSL signal control circuit 20 and is configured to generate a column-select line (CSL) signal according to the first signal (CAI) and the second signal (CAD). In this manner, the circuit for adaptive column-select line signal generation can be utilized to implement the method of FIG. 5 or embodiments based on FIG. 5.

In some embodiments, the initiation signal generating circuit 10 is configured to generate a first signal (CAI) in response to a memory access command, for example, a write or read command issued in the DRAM device, as illustrated in the above or other examples related to FIG. 6-8 or other figures for asserting the first signal. For instance, the initiation signal generating circuit 10 is configured, in response to a write command issued in the DRAM device, to assert a first signal (CAI) after a time interval (e.g., period T0 to T24) equal to a write latency (WL) plus an extra number of clock cycles elapses. The initiation signal generating circuit 10 can be configured to obtain one or more parameters associated with a write latency (WL) for the DRAM device, for example, from a mode register set compliant with the memory specification. The initiation signal generating circuit 10 can be realized by using a logic circuit or other appropriate digital or analog circuits, for example, a digital delay circuit which can be digitally controlled in response to the memory access command. Further, the initiation signal generating circuit 10 can be configured to assert a subsequent first signal (CAI) in response to a read command issued next to the write command, as illustrated in FIG. 6.

In some embodiments, the CSL signal control circuit 20 is configured to determine the selected candidate signal from the plurality of candidate signals (e.g., CAD_CK and CAD_DE), wherein the selected candidate signal is asserted before the remaining part (or other candidate signal(s)) of the plurality of candidate signals after the first signal is asserted, and the CSL signal control circuit 20 is configured to output the selected candidate signal as the second signal (CAD). For example, the CSL signal control circuit 20 comprises a control circuit configured to determine the selected candidate signal from the plurality of candidate signals (e.g., CAD_CK and CAD_DE), and the control circuit is configured to output the selected candidate signal as the second signal (CAD).

Figure 10:
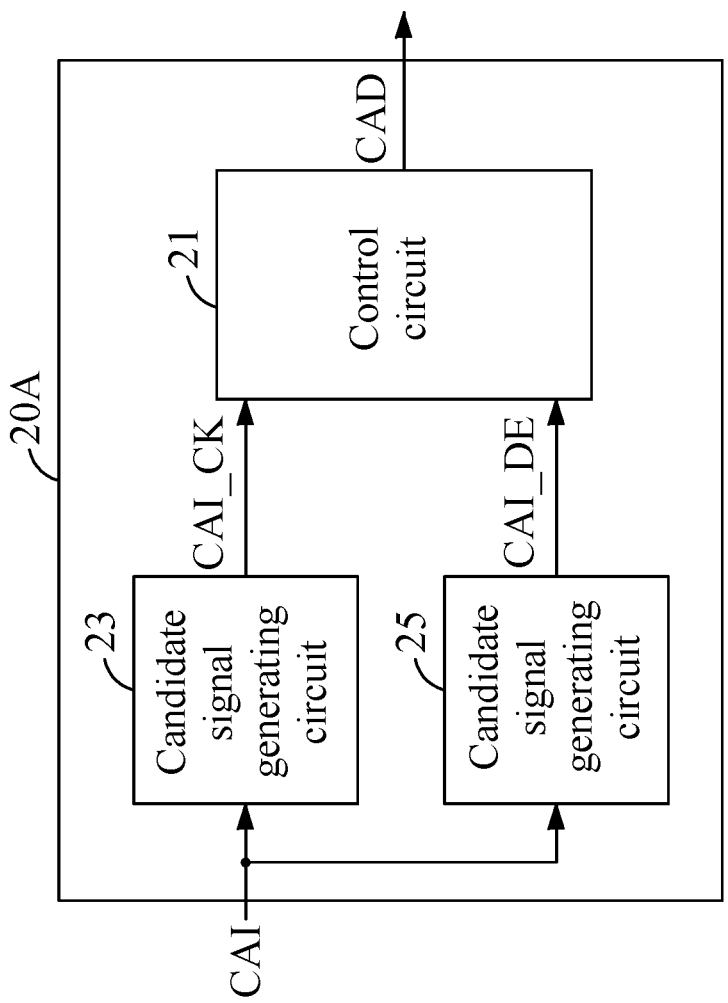
FIG. 10 is a block diagram illustrating an embodiment of a CSL signal control circuit of FIG. 9.

Refer to FIG. 10, which is a block diagram illustrating an embodiment of a CSL signal control circuit of FIG. 9. In FIG. 10, a CSL signal control circuit 20A is an embodiment of the CSL signal control circuit 20 and is configured to generate a second signal (CAD) according to a first signal (CAI). The CSL signal control circuit 20A includes a control circuit 21 and a plurality of candidate signal generating circuits 23, 25.

Figure 11:
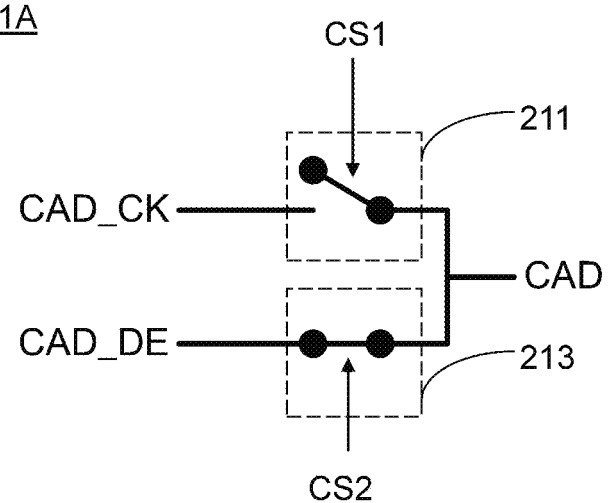
FIG. 11 is a block diagram illustrating an embodiment of a control circuit for generating a second signal (CAD) according to candidate signals.

Refer to FIG. 11, which is a block diagram illustrating an embodiment of a control circuit for generating a second signal (CAD) according to candidate signals. In FIG. 11, a control circuit 21A has a plurality of input terminals for receiving a plurality of candidate signals (e.g., CAD_CK and CAD_DE) and an output terminal for outputting the second signal (CAD). The control circuit 21A includes a plurality of signal paths each of which is connected to a corresponding one of the input terminals, a corresponding switch, and the output terminal. For example, in FIG. 11, a first signal path includes an input terminal for receiving a candidate signal CAD_CK, a corresponding switch 211, and the output terminal; and a second signal path includes another input terminal for receiving a candidate signal CAD_DE, a corresponding switch 213, and the output terminal. In addition, the switches of the signal paths (e.g., switches 211, 213) are controlled by respective control signals (e.g., denoted by CS1, CS2).

By way of using the control signals, the control circuit 21A can be configured to determine a candidate signal selected from the plurality of candidate signals (e.g., CAD_CK and CAD_DE) and to output the selected candidate signal as the second signal (CAD), wherein the selected candidate signal is asserted before the remaining part (or other candidate signal(s)) of the plurality of candidate signals after the first signal is asserted. For example, initially, the switches (e.g., 211, 213) in the signal paths can be turned on through assertion of the control signals (e.g., denoted by CS1, CS2) after the first signal is asserted. In one case, when the candidate signal CAD_CK is asserted before the candidate signal CAD_DE is asserted (as exemplified in FIG. 7), the control signal CS1 maintains asserted and the control signal CS2 turns to be de-asserted so that the switch 211 is still being turned on and the switch 213 is turned off, resulting in the candidate signal CAD_CK being the selected candidate signal. In another case, when the candidate signal CAD_DE is asserted before the candidate signal CAD_CK is asserted (as exemplified in FIG. 8), the control signal CS2 maintains asserted and the control signal CS1 turns to be de-asserted so that the switch 213 is still being turned on and the switch 211 is turned off, resulting in the candidate signal CAD_DE being the selected candidate signal. In this manner, the control circuit 21A only selects one of the candidate signals, transmits the selected candidate signal through its corresponding signal path, and outputs the selected candidate signal as the second signal (CAD). The control circuit 21A illustrated in FIG. 11, or any embodiments based on this, can be utilized in implementation of the circuit regarding step S20 of the method illustrated in FIG. 5, such as the CSL signal control circuit (e.g., 20, 20A) or the control circuit 21. Besides, the control circuit 21A can be further implemented for more candidate signals according to the above examples.

Figure 12:
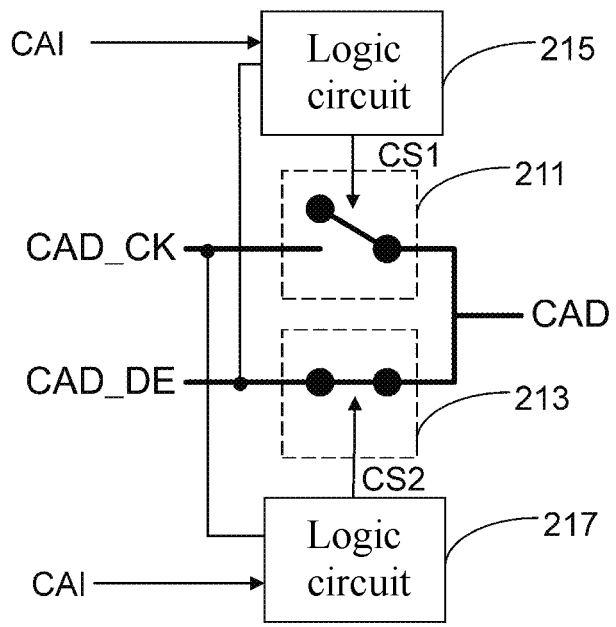
FIG. 12 is a block diagram illustrating an embodiment of a control circuit for generating a second signal (CAD) according to candidate signals.

Refer to FIG. 12, which is a block diagram illustrating an embodiment of a control circuit for generating a second signal (CAD) according to candidate signals. A control circuit 21B as shown in FIG. 12 is based on the architecture of the embodiment illustrated in FIG. 11. As compared to the control circuit 21A of FIG. 11, the control circuit 21B further comprises a logic circuit 215 and a logic circuit 217. The logic circuit 215 outputs the control signal CS1 according to the first signal (CAI) and the candidate signal CAD_DE so as to control the switch 211 in the signal path for the candidate signal CAD_CK. The logic circuit 217 outputs the control signal CS2 according to the first signal (CAI) and the candidate signal CAD_CK so as to control the switch 213 in the signal path for the candidate signal CAD_DE. The logic circuits 215, 217 are capable of operating in the similar manner in the respective signal paths for the candidate signals. The operations for the control circuit 21B with control signals CS1, CS2 are similar to those of the control circuit 21A.

Figure 13:
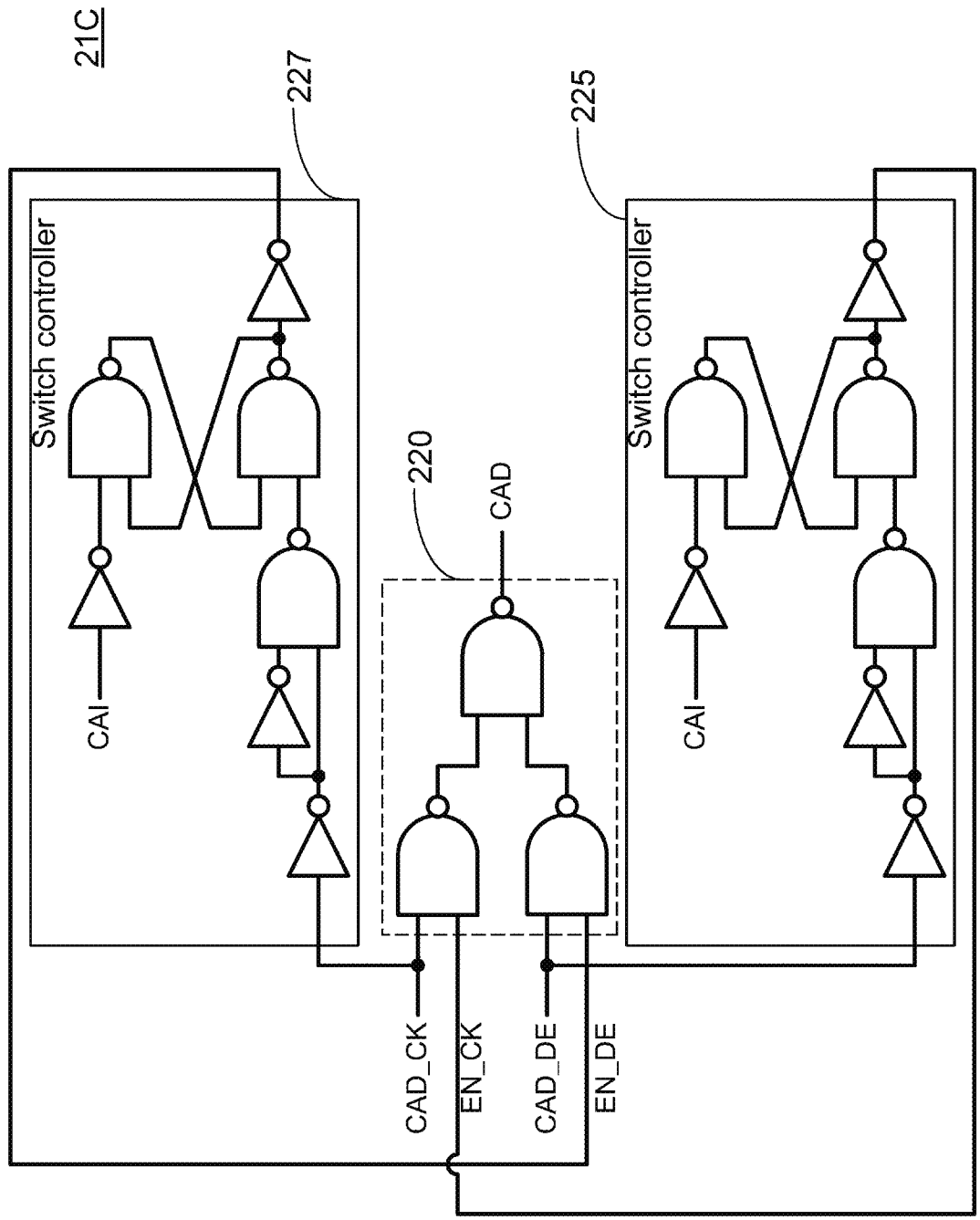
FIG. 13 is a schematic circuit diagram illustrating an embodiment of a control circuit for generating a second signal (CAD) according to candidate signals.

Refer to FIG. 13, which is a schematic circuit diagram illustrating an embodiment of the circuit for generating a second signal (CAD) according to candidate signals. A control circuit 21C as shown in FIG. 13 is based on the architecture of the embodiment illustrated in FIG. 11 or 12. As compared to the control circuit 21B of FIG. 12, the control circuit 21C comprises an output circuit 220, switch controller 225, and switch controller 227.

The output circuit 220 outputs the second signal (CAD) according to the candidate signals CAD_CK and CAD_DE. The output circuit 220 can be regarded as a circuit implementation of the switches 211 and 213. The output circuit 220 is also controlled according to respective control signals, denoted by EN_CK and EN_DE, as compared to control signals CS1, CS2 of the control circuit 21A or 21B. As exemplified in FIG. 13, the output circuit 220 can be implemented by a logic circuit including a plurality of logic gates such as NAND gates. In other examples, the output circuit 220 can be implemented by any appropriate logic gates and/or appropriate circuit components and so on.

The switch controller 225 is used for generating the control signal EN_CK according to the first signal (CAI) and the candidate signal CAD_DE so as to control the output circuit 220 in the signal path for the candidate signal CAD_CK. The switch controller 227 is used for generating the control signal EN_DE according to the first signal (CAI) and the candidate signal CAD_CK so as to control the output circuit 220 in the signal path for the candidate signal CAD_DE.

As exemplified in FIG. 13, the switch controller 225 or 227 can be implemented by a logic circuit including a plurality of logic gates such as NAND gates, NOT gates, or other gates, and/or digital circuit components and so on. The switch controller 225 or 227 is implemented based on a flip-flop, such as a reset-set (RS) flip-flop.

Figure 14:
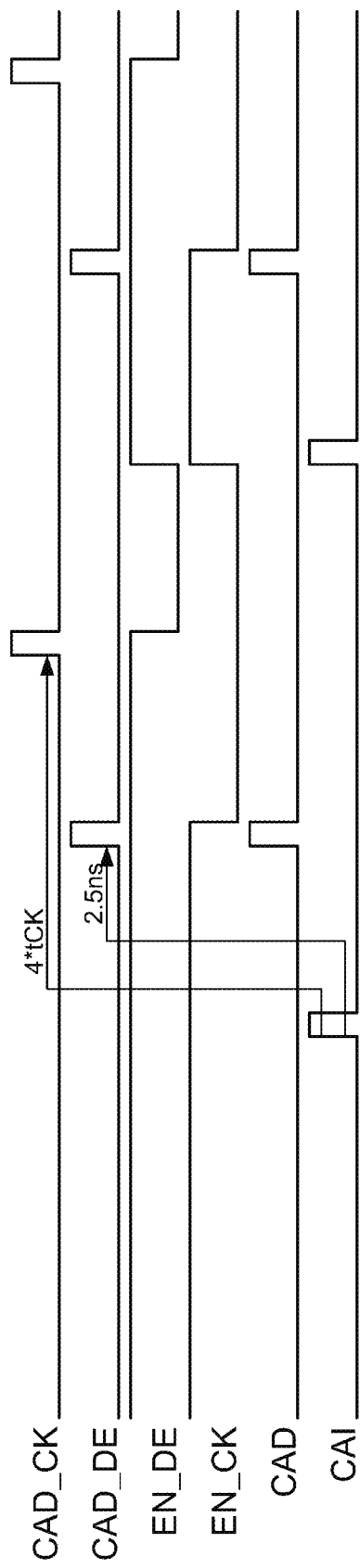
FIG. 14 is a timing diagram illustrating an example of generating a second signal (CAD) according to candidate signals by using the control circuit of FIG. 13.

Refer to FIG. 14, which is a timing diagram illustrating an example of generating a second signal (CAD) according to candidate signals by using the control circuit of FIG. 13.

Refer to FIGS. 13 and 14 for explanation of the circuit operations with the control signals. Initially, the logic circuits 225 and 227 (or 215 and 217 in FIG. 12) can assert the control signals EN_CK and EN_DE (or CS1, CS2 in FIG. 12) in response to assertion of the first signal (CAI) so as to turn on the output circuit 220 (or the switches 211, 213 in FIG. 12) in the signal paths. After the first signal (CAI) is asserted, the candidate signals CAD_CK and CAD_DE will be asserted individually after respective delays. In response to one of the candidate signals being asserted first (e.g., CAD_DE), the logic circuit 225 (or 215 in FIG. 12) for the other candidate signal (e.g., CAD_CK) de-asserts the corresponding control signal EN_CK (or CS1 in FIG. 12) so that the signal path for the other candidate signal (e.g., CAD_CK) in the output circuit 220 (or the corresponding switch 211 in FIG. 12) is turned off. In the meantime, the logic circuit 227 (or 217 in FIG. 12) for the candidate signal being asserted first (e.g., CAD_DE) keeps the corresponding control signal EN_DE (e.g., CS2) asserted so that the signal path for the candidate signal asserted first (e.g., CAD_DE) in the output circuit 220 (or the corresponding switch 213 in FIG. 12) is still being turned on and conducts this candidate signal asserted first (e.g., CAD_DE). Then, the logic circuit 227 (or 217 in FIG. 12) for the candidate signal being asserted first (e.g., CAD_DE) de-asserts the corresponding control signal EN_DE (e.g., CS2) when the candidate signal (e.g., CAD_CK) is asserted. The logic circuits 225, 227 are capable of operating in the similar manner in the respective signal paths for the candidate signals. The operations for the control circuit 21C with control signals EN_CK, EN_DE are similar to those of the control circuit 21A or 21B and will not be detailed for the sake of brevity.

The following provides some embodiments regarding generation of the candidate signals.

For example, as illustrated in FIG. 10, the candidate signal generating circuit 23 has an input terminal for receiving the first signal (CAI) and an output terminal for outputting a candidate signal (e.g., CAD_CK) and can be implemented to include circuitry for generating the candidate signal CAD_CK according to a configurable time interval with respect to a parameter k from a register set (e.g., mode registers) after the first signal is asserted. The candidate signal generating circuit 23 can be implemented by using a logic circuit, a reading circuit configured to read a register set storing the value for mode registers defined by the DDR specification, and/or a pulse generator or other appropriate circuits, such as logic circuits, timers, delay circuits, amplifiers and so on. The candidate signal generating circuit 23 can be implemented to be configurable so that the candidate signal CAD_CK is generated with a pulse for a delay of k clock cycles (e.g., k*tCK) after the first signal (CAI) is asserted.

For example, the candidate signal generating circuit 25 has an input terminal for receiving the first signal (CAI) and an output terminal for outputting a candidate signal (e.g., CAD_DE) and can be implemented to include circuitry for generating the candidate signal CAD_DE according to a specified time interval after the first signal is asserted. The candidate signal generating circuit 25 can be implemented by using a logic circuit, and/or a pulse generator or other appropriate circuits, such as logic circuits, timers, delay circuits, amplifiers and so on. The candidate signal generating circuit 23 can be implemented so that the candidate signal CAD_DE is generated with a pulse for a delay of a specified time interval after the first signal (CAI) is asserted.

TABLE 1 illustrates a plurality of examples of settings for mode registers for double-data rate (DDR) series specification. The user can select one of the values in the first column of TABLE 1 and set the selected value in a register set, such as mode registers defined by the DDR specification and implemented in a memory device. The second column of TABLE 1 can be used for implementation of the candidate signal generating circuit 23 to generate the candidate signal CAD_CK, wherein the parameter k can be set to 2, 2.5, 3, 3.5, or 4. The third column of TABLE 1 can be used for implementation of the candidate signal generating circuit 25 to generate the candidate signal CAD_DE.

TABLE 1

| MR6 setting for tCCD_L.min(nCK) | CAI to CAD_CK delay | CAI to CAD_DE delay |
|---|---|---|
| 4 | 2*tCK | 2.5 ns |
| 5 | 2.5*tCK | 2.5 ns |
| 6 | 3*tCK | 2.5 ns |
| 7 | 3.5*tCK | 2.5 ns |
| 8 | 4*tCK | 2.5 ns |

Figure 15:
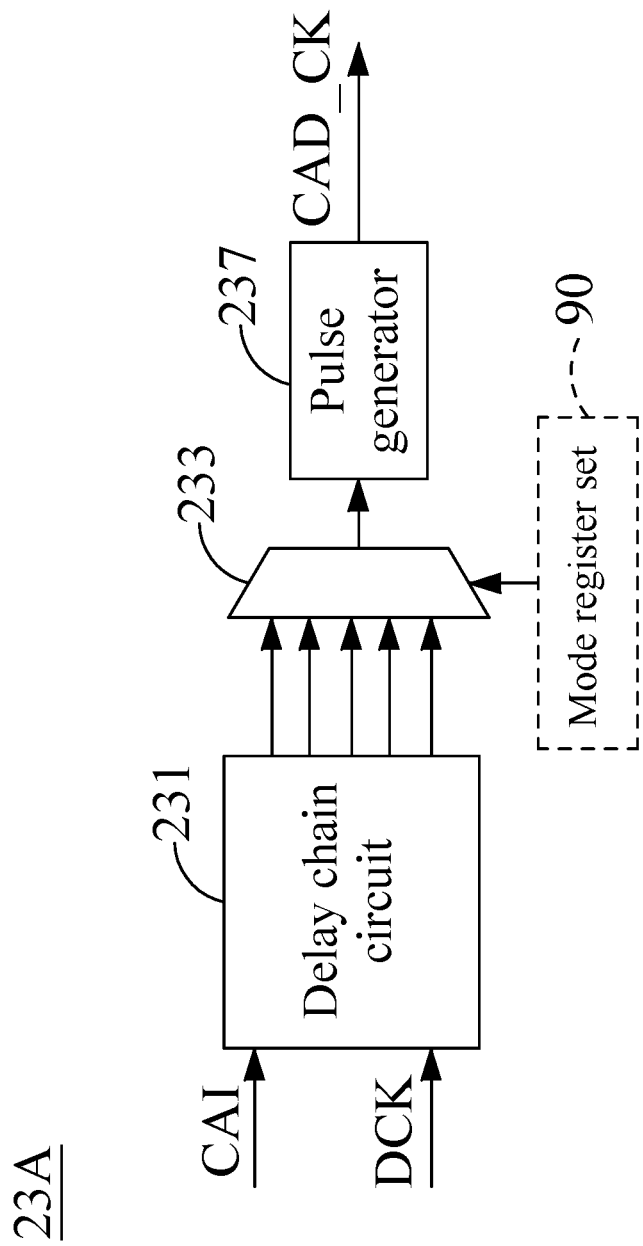
FIG. 15 is a block diagram illustrating an embodiment of a candidate signal generating circuit.

Refer to FIG. 15, which is a block diagram illustrating an embodiment of a candidate signal generating circuit. In FIG. 15, a candidate signal generating circuit 23A is an embodiment of the candidate signal generating circuit 23 for generating a candidate signal (e.g., denoted by CAD_CK) according to a configurable time interval with respect to a parameter k from a register set (e.g., a mode register set 90) after the first signal (CAI) is asserted. As shown in FIG. 15, the candidate signal generating circuit 23A includes a delay chain circuit 231, a multiplexer 233, and a pulse generator 237. The delay chain circuit 231 receives the first signal (CAI) and a clock signal (e.g., denoted by DCK) and outputs a plurality of delayed signals with different delay times with respect to the first signal (CAI). The multiplexer 233 is used to select and output one of the plurality of delayed signals according to a selection signal, wherein the selection signal is based on one or more corresponding parameters from the mode register set 90. The pulse generator 237 generates a pulse in response to the output signal of the multiplexer 233 so as to generate the candidate signal CAD_CK.

For example, as shown in the second column of TABLE 1, the mode register set MR6 has specific registers storing setting for tCCD_L·min with a value of 4, 5, 6, 7, or 8 corresponding to the parameter k set to 2, 2.5, 3, 3.5, or 4 respectively. Accordingly, the delay chain circuit 231 can be realized to generate a plurality of delayed signals with respective delay times for 2*tCK, 2.5*tCK, 3*tCK, 3.5*tCK, or 4*tCK. In addition, the multiplexer 233 can be configured to select and output a delayed signal from the plurality of delayed signals according to a selection signal based on the value of the setting from the mode register set MR6. For instance, the multiplexer 233 can be configured to select the delayed signal with a delay time for 2*tCK according to a selection signal indicating 4; and so on.

Figure 16:
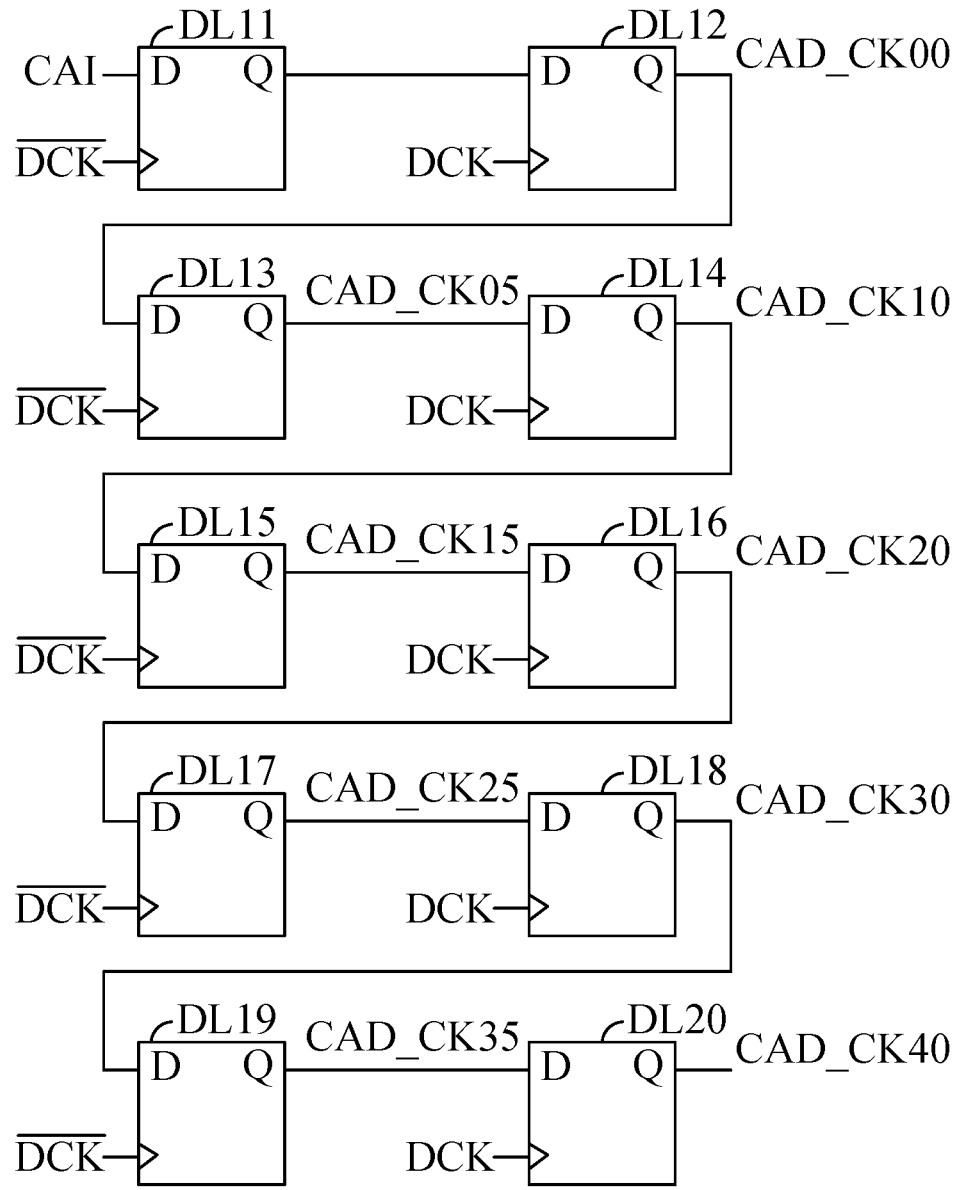
FIG. 16 is a schematic circuit diagram illustrating an embodiment of a delay chain circuit of FIG. 15.

Refer to FIG. 16, which is a schematic circuit diagram illustrating an embodiment of a delay chain circuit of FIG. 15. As shown in FIG. 16, a delay chain circuit 231A includes a plurality of delay units, such as D-latches, denoted by DL11-DL20, coupled in a series or chain manner. The delay unit DL11 has an input terminal (denoted by D) for receiving the first signal (CAI) and an output terminal (denoted by Q), wherein the delay unit DL11 is clocked by an inverted version of the clock signal DCK, i.e. $\overline{DCK}$. The delay unit DL12 has an input terminal (D) for receiving the output of the delay unit DL11 and an output terminal (Q) for outputting a delayed signal (e.g., denoted by CAD_CK00), wherein the delay unit DL12 is clocked by the clock signal DCK. Likewise, the delay units DL13 to DL20 are connected in a series or chain manner so as to generate the delayed signals (e.g., denoted by CAD_CK05, CAD_CK10, . . . , CAD_CK40). For example, the delayed signals CAD_CK20, CAD_CK25, CAD_CK30, CAD_CK35, and CAD_CK40 are output to the multiplexer 233.

Figure 17:
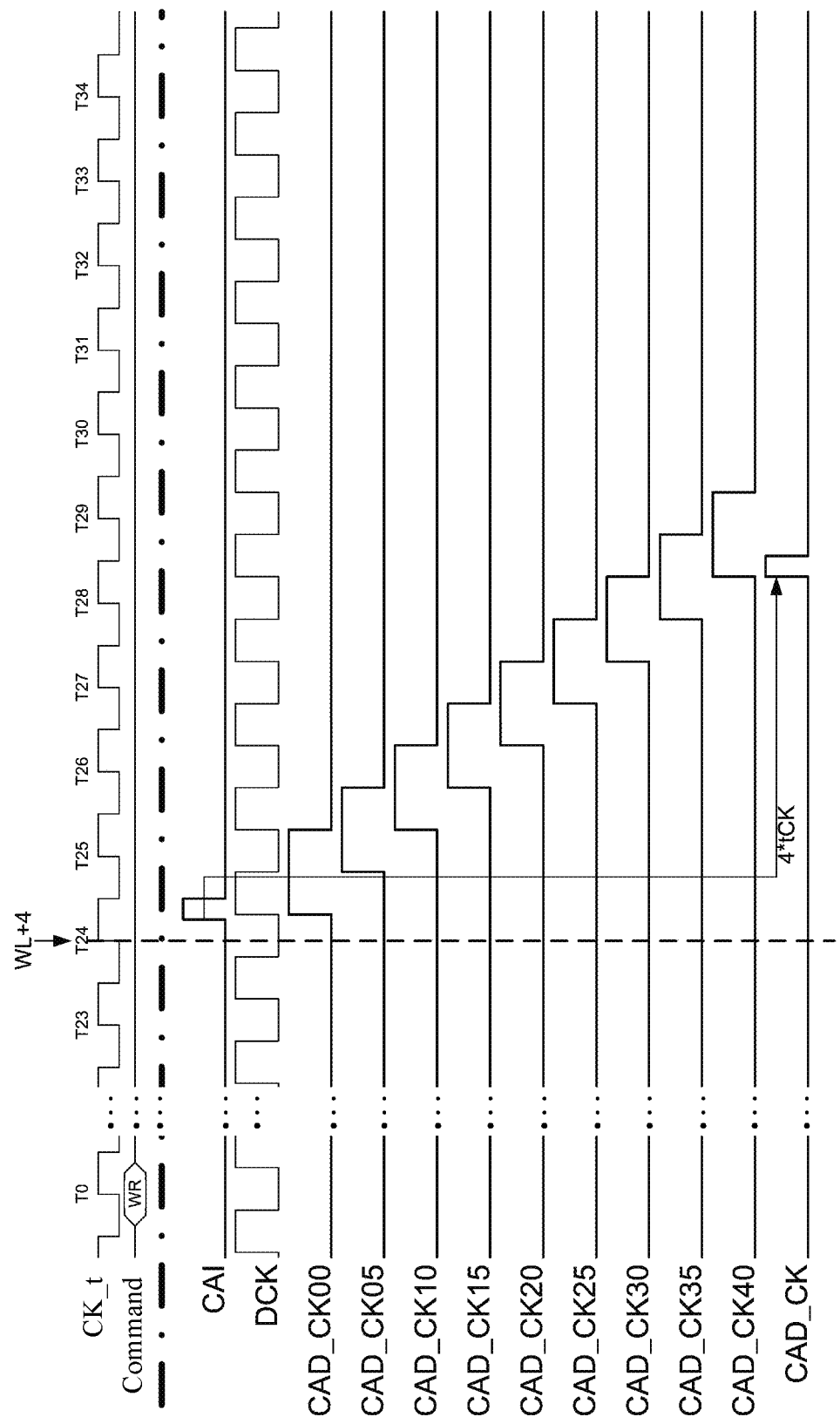
FIG. 17 is a timing diagram illustrating an example of generating a candidate signal (CAD_CK) by using the circuits of FIG. 15 and FIG. 16.

Refer to FIG. 17, which is a timing diagram illustrating an example of generating a candidate signal (CAD_CK) by using the circuits of FIG. 15 and FIG. 16. As illustrated in FIG. 17, in response to a write command (WR), a first signal (CAI) is asserted as a pulse after a time interval for a write latency (WL) plus an extra number of clock signals (e.g., totally WL+4). The assertion of the first signal (CAI) activates the delay chain circuit 231A so that the delayed signals CAD_CK00 to CAD_CK40 are generated as pluses sequentially. In an example, the multiplexer 233 outputs the delayed signal CAD_CK40 in response to the selection signal associated with tCCD_L·min of 8 or parameter k of 4. Accordingly, the pulse generator 237 generates a pulse as the candidate signal CAD_CK in response to the assertion of the delayed signal CAD_CK40.

In some embodiments, as illustrated in FIG. 9, the CSL signal output circuit 30 comprises: a first signal input terminal, a second signal input terminal, an output terminal, and an output logic circuit. The first signal input terminal is used for receiving the first signal (CAI). The second signal input terminal is used for receiving the second signal (CAD).

The output terminal is used for outputting the column-select line (CSL) signal. The output logic circuit is used for generating the column-select line (CSL) signal, wherein the output logic circuit is configured to assert the column-select line (CSL) signal after the first signal (CAI) is asserted; and the output logic circuit is configured to de-assert the column-select line (CSL) signal after the second signal (CAD) is asserted, as illustrated in FIG. 6, 7 or 8.

Figure 18:
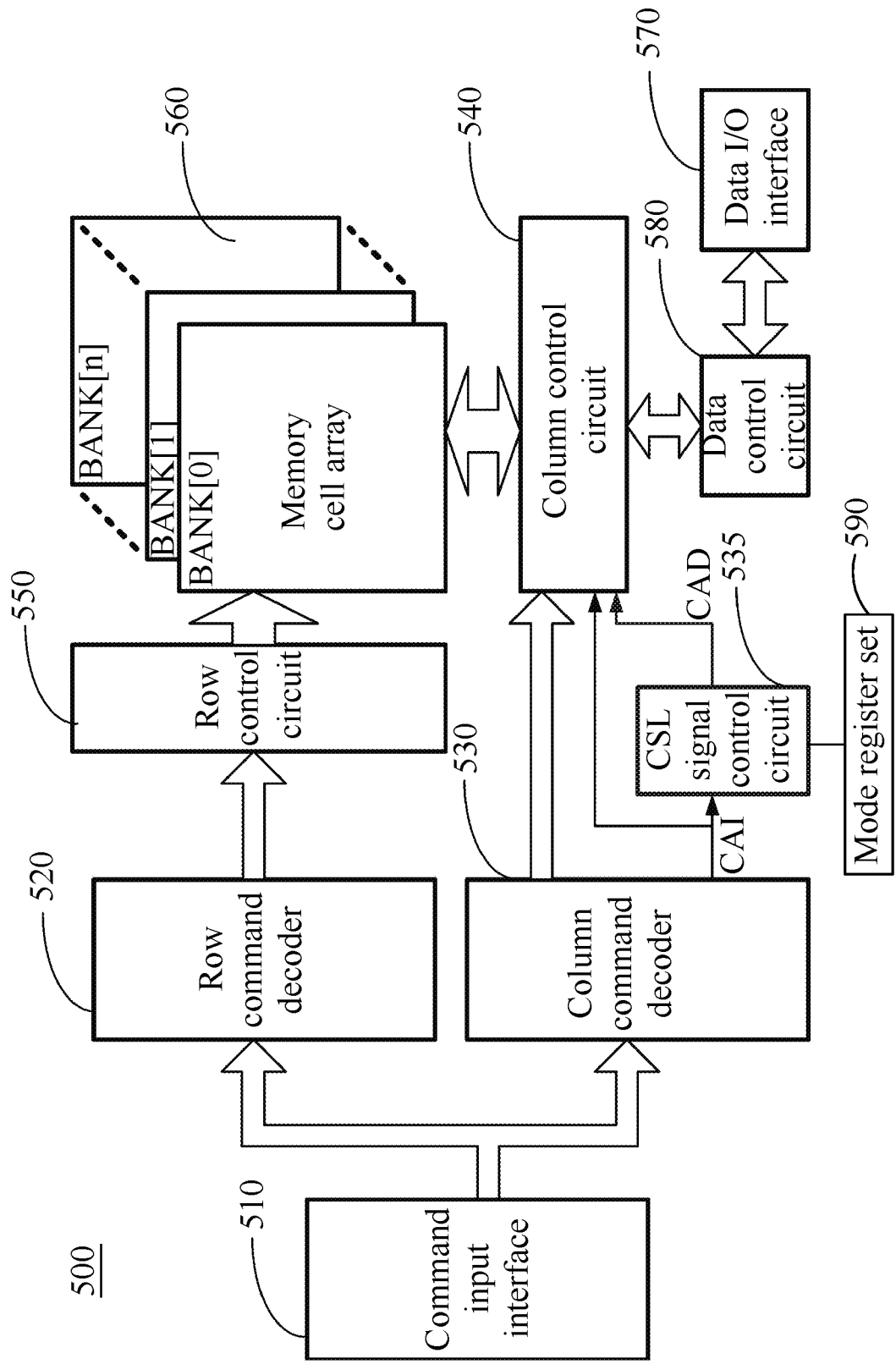
FIG. 18 is a block diagram illustrating architecture of a memory device in which a circuit for adaptive column-select line (CSL) signal generation according to a first signal (CAI) and a second signal (CAD) is utilized according to an embodiment of the present disclosure.

Refer to FIG. 18, which is a block diagram illustrating architecture of a memory device in which a circuit for adaptive column-select line (CSL) signal generation according to a first signal (CAI) and a second signal (CAD) is utilized according to an embodiment of the present disclosure. In FIG. 18, a memory device 500 includes a command input interface 510, row command decoder 520, column command decoder 530, column-select (CSL) signal control circuit 535, column control circuit 540, row control circuit 550, memory cell array 560, data input/output interface 570, and data control circuit 580. The command input interface 510 is configured to receive external signals, such as, CK_t, CK_c, CKE, CS_n, ACT_n, RAS_n, CAS_n, WE_n, BG0, BG1, BA0, BA1, A0-A13, as specified by the DDR series memory specification, and accordingly output commands or control signals to subsequent circuits, for example, the row command decoder 520 and column command decoder 530. The data input/output interface 570 is configured to receive or transmit signals, such as, DQ0-DQ7, LDQS_t, LDQS_c, DQ8-DQ15, UDQS, t_UDQS_c, as specified by the DDR series memory specification. The memory cell array 560 can be implemented to include a plurality of banks, such as BANK[0], BANK[1] to BANK[n].

The circuit for adaptive column-select line signal generation 1 illustrated in FIG. 9 (or its embodiments based on FIG. 5 or 9) can be implemented in the memory device 500. Referring to FIGS. 9 and 15, in an embodiment, the initiation signal generating circuit 10, CSL signal control circuit 20, and CSL signal output circuit 30 can be implemented in the column command decoder 530, column-select (CSL) signal control circuit 535, column control circuit 540, respectively.

In some embodiments, the initiation signal generating circuit 10 can be implemented in the column command decoder 530 and the CSL signal control circuit 20 and CSL signal output circuit 30 can be implemented in the column control circuit 540 so that the column-select (CSL) signal control circuit 535 can be embedded into the column control circuit 540. Further, a mode register set 590, as specified by a memory specification (e.g., DDR series) can be provided and coupled to the CSL signal control circuit 535. For example, the CSL signal control circuit 535 can be configured to generate a first candidate signal according to a configurable time interval with respect to a parameter obtained from the mode register set 590 and to generate a second candidate signal according to a specified time interval. Certainly, the implementation of the invention is not limited to the examples. In some embodiments, the mode register set 590 can be realized in one or more circuit units (such as 510, 520, 530, 540, or 550 in FIG. 18) whenever appropriate.

As a result, provided are the embodiments of a method and a circuit for adaptive column-select line signal generation for a memory device in order to adaptively control the column-select line signal, thus facilitating stability of access operations of the memory device.

Moreover, in the embodiments (e.g., FIG. 9 and FIG. 10) associated with a circuit for adaptive column-select line signal generation, at least one or a combination of circuits may be implemented by one or more circuits, for example, a microprocessor, a processor, or a digital signal processor. Alternatively, the circuits above may be designed based on Hardware Description Language (HDL) or techniques of other design manner of digital circuits generally known to a person skilled in the art, and may be implemented by one or more of circuits based on a field programmable gate array (FPGA), an application-specific integrated circuit (ASIC) or a complex programmable logic device (CPLD), or be implemented by a dedicated circuit or module. However, the implementation of the present invention is not limited to the examples above. Moreover, the steps S10 to S30 in FIG. 5 may be implemented by a logic circuit or other appropriate digital or analog circuits.

While the present disclosure has been described by means of specific embodiments, numerous modifications and variations could be made thereto by those skilled in the art without departing from the scope and spirit of the present disclosure set forth in the claims.

What is claimed is:

1. A method for adaptive column-select line signal generation for a memory device, the method comprising:
   generating a first signal in response to a memory access command;
   generating a second signal according to a candidate signal selected from a plurality of candidate signals including a first candidate signal and a second candidate signal, wherein in response to the first signal is asserted, the first candidate signal is asserted when a configurable time interval with respect to a parameter from a register set elapses and the second candidate signal is asserted when a specified time interval elapses, and the selected candidate signal is asserted before a remaining part of the candidate signals after the first signal is asserted; and
   generating a column-select line signal according to the first signal and the second signal.

2. The method according to claim 1, wherein the step of determining the second signal comprises:
   determining the selected candidate signal from the plurality of candidate signals, wherein the selected candidate signal is asserted before the remaining part of the candidate signals after the first signal is asserted; and
   outputting the selected candidate signal as the second signal.

3. The method according to claim 2, wherein the step of determining the second signal further comprises:
   generating the first candidate signal according to the configurable time interval with respect to the parameter from the register set after the first signal is asserted;
   generating the second candidate signal according to the specified time interval after the first signal is asserted.

4. The method according to claim 1, wherein the step of generating the column-select line signal comprises:
   receiving the first signal and the second signal to generate the column-select line signal;
   asserting the column-select line signal after the first signal is asserted; and
   de-asserting the column-select line signal after the second signal is asserted.

5. A circuit for adaptive column-select line signal generation for a memory device, the circuit comprising:
   an initiation signal generating circuit configured to generate a first signal in response to a memory access command;
   a column-select line signal control circuit coupled to the initiation signal generating circuit and configured to generate a second signal according to a candidate signal selected from a plurality of candidate signals including a first candidate signal and a second candidate signal, wherein after the first signal is asserted, the first candidate signal is asserted when a configurable time interval with respect to a parameter from a register set elapses and the second candidate signal is asserted when a specified time interval elapses, and the selected candidate signal is asserted before a remaining part of the candidate signals after the first signal is asserted; and a column-select line (CSL) signal output circuit coupled to the column-select line signal control circuit and configured to generate a column-select line signal according to the first signal and the second signal.

6. The circuit according to claim 5, wherein the CSL signal control circuit comprises:

a control circuit configured to determine the selected candidate signal from the plurality of candidate signals, wherein the selected candidate signal is asserted before the remaining part of the candidate signals after the first signal is asserted, and the control circuit is configured to output the selected candidate signal as the second signal.

7. The circuit according to claim 6, wherein the CSL signal control circuit further comprises:

a first candidate signal generating circuit configured to generate the first candidate signal according to the configurable time interval with respect to the parameter from the register set after the first signal is asserted; and a second candidate signal generating circuit configured to generate the second candidate signal according to the specified time interval after the first signal is asserted.

8. The circuit according to claim 5, wherein the CSL signal output circuit comprises:

a first signal input terminal for receiving the first signal;

a second signal input terminal for receiving the second signal;

a column-select line (CSL) signal output terminal for outputting the column-select line signal; and an output logic circuit for generating the column-select line signal, wherein the output logic circuit is configured to assert the column-select line signal after the first signal is asserted, and the output logic circuit is configured to de-assert the column-select line signal after the second signal is asserted.

9. The circuit according to claim 5, wherein the column-select line signal control circuit is coupled between a column command decoder and a column control circuit of the memory device.

10. The circuit according to claim 5, wherein the initiation signal generating circuit is disposed in a column command decoder of the memory device.

11. The circuit according to claim 5, wherein the column-select line (CSL) signal output circuit is disposed in a column control circuit of the memory device.

\* \* \* \* \*